US 12,517,167 B2

(12) United States Patent
Yoshida et al.

(10) Patent No.: US 12,517,167 B2
(45) Date of Patent: Jan. 6, 2026

(54) SEMICONDUCTOR DEVICE

(71) Applicant: Mitsubishi Electric Corporation, Tokyo (JP)

(72) Inventors: Kentaro Yoshida, Tokyo (JP); Kei Hayashi, Tokyo (JP); Fumio Wada, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 89 days.

(21) Appl. No.: 18/254,578

(22) PCT Filed: Feb. 2, 2021

(86) PCT No.: PCT/JP2021/003719
§ 371 (c)(1),
(2) Date: May 25, 2023

(87) PCT Pub. No.: WO2022/168156
PCT Pub. Date: Aug. 11, 2022

(65) Prior Publication Data
US 2024/0003960 A1    Jan. 4, 2024

(51) Int. Cl.
*G01R 31/26* (2020.01)
*G01R 19/00* (2006.01)
*H01L 23/528* (2006.01)

(52) U.S. Cl.
CPC ..... *G01R 31/2621* (2013.01); *G01R 19/0092* (2013.01); *H01L 23/5283* (2013.01)

(58) Field of Classification Search
CPC ............. G01R 15/181; G01R 15/207; G01R 19/0092; G01R 19/16552; G01R 31/26;
(Continued)

(56) References Cited

U.S. PATENT DOCUMENTS

| 7,742,273 B1* | 6/2010 | Shvartsman | ....... H03K 17/0822 |
| | | | 361/103 |
| 2014/0040692 A1* | 2/2014 | Shah | ........... G11C 29/021 |
| | | | 714/E11.167 |

(Continued)

FOREIGN PATENT DOCUMENTS

JP    H11-317495 A    11/1999

OTHER PUBLICATIONS

International Search Report issued in PCT/JP2021/003719; mailed Apr. 27, 2021.

*Primary Examiner* — Judy Nguyen
*Assistant Examiner* — Adam S Clarke
(74) *Attorney, Agent, or Firm* — Studebaker Brackett PLLC (57) ABSTRACT

The object is to provide a technology for enabling reduction in the size of a semiconductor device. The semiconductor device includes a first semiconductor element and a second semiconductor element. An output of the first semiconductor element is connected to an output of the second semiconductor element through wiring. A main current flows through the first semiconductor element, and a sensing current flows through the second semiconductor element. The sensing current has a correlation with the main current. The semiconductor device further includes a current sensor. The current sensor senses the sensing current flowing through the second semiconductor element in a contactless manner.

13 Claims, 10 Drawing Sheets

(58) Field of Classification Search
CPC ........ G01R 31/2621; H01L 2224/0603; H01L 2224/48091; H01L 2224/49111; H01L 23/5283; H01L 25/16; H01L 2924/00014; H01L 2924/19107

See application file for complete search history.

(56) References Cited

U.S. PATENT DOCUMENTS

| | | | |
|---|---|---|---|
| 2016/0211657 A1* | 7/2016 | Hayashi | H03K 17/0828 |
| 2019/0043791 A1* | 2/2019 | Haga | H01L 23/4952 |
| 2020/0336069 A1* | 10/2020 | Yao | H02M 3/1588 |
| 2020/0363463 A1* | 11/2020 | Mauder | H01L 23/373 |

* cited by examiner

SEMICONDUCTOR DEVICE

TECHNICAL FIELD

The present disclosure relates to a semiconductor device.

BACKGROUND ART

Various technologies for sensing a current flowing through a semiconductor element included in a semiconductor device in a semiconductor module such as a power module have been proposed to protect the semiconductor element. For example, Patent Document 1 proposes a semiconductor module which includes a semiconductor element and a current sensing coil and which senses a main current of the semiconductor element using the current sensing coil.

PRIOR ART DOCUMENT

Patent Document

Patent Document 1: Japanese Patent Application Laid-Open No. H11-317495

Problem to be Solved by the Invention

However, sensing the main current of the semiconductor element requires disposing the current sensing coil around a main current path. Thus, the size of the current sensing coil becomes relatively large. This consequently causes a problem in increasing the size of a semiconductor device including the current sensing coil.

The present disclosure has been conceived in view of the problem, and has an object of providing a technology for enabling reduction in the size of the semiconductor device.

Means to Solve the Problem

A semiconductor device according to the present disclosure includes: a first semiconductor element through which a main current flows; a second semiconductor element which includes an output connected to an output of the first semiconductor element through wiring and through which a sensing current flows, the sensing current having a correlation with the main current; and a current sensor sensing the sensing current in a contactless manner.

Effects of the Invention

Since the present disclosure allows sensing a sensing current in a contactless manner, a current sensor can be miniaturized, and the size of a semiconductor device can be reduced.

The object, features, aspects, and advantages of the present disclosure will become more apparent from the following detailed description and the accompanying drawings.

DESCRIPTION OF EMBODIMENTS

Embodiments will be described with reference to the attached drawings. The features to be described in Embodiments below are illustrative, and all of the features are not necessarily essential. In the description below, identical constituent elements in a plurality of Embodiments will be denoted by the same or similar reference numerals, and the different constituent elements will be mainly described. In the following description, a particular position and a particular direction such as "up", "down", "left", "right", "front", or "back" need not always coincide with an actual direction.

Embodiment 1

Figure 1:
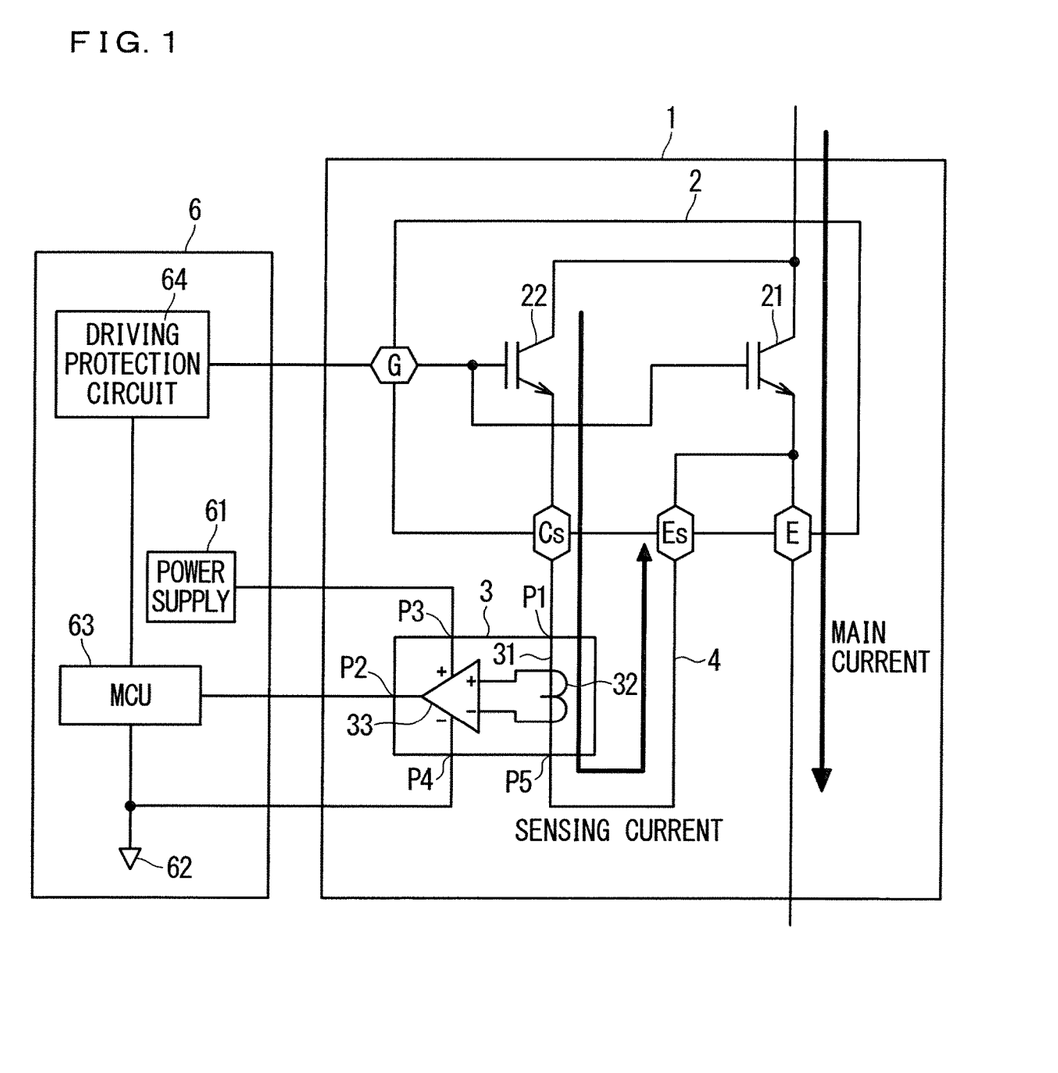
FIG. 1 is a circuit diagram illustrating a structure of a semiconductor device according to Embodiment 1.

FIG. 1 is a circuit diagram illustrating a structure of a semiconductor device according to Embodiment 1. The semiconductor device in FIG. 1 includes a semiconductor module 1, and a driving substrate 6 that is a circuit board. The semiconductor module 1 is a power converter including a semiconductor element 2 and a current sensor 3.

The semiconductor element 2 includes, for example, an insulated-gate bipolar transistor (IGBT), a metal-oxide-semiconductor field-effect transistor (MOSFET), and a bipolar junction transistor (BJT). Embodiment 1 will describe, but not limited to, the semiconductor element 2 including a main element 21 that is a first semiconductor element, and a sensing element 22 that is a second semiconductor element, where the main element 21 and the sensing element 22 are IGBTs.

The main element 21 and the sensing element 22 are disposed on the same semiconductor substrate. Here, the respective elements of the main element 21 and the sensing element 22 are substantially structured in the same manner except its area on the semiconductor substrate. As the area of each of the elements on the semiconductor substrate increases, the current flowing through the element increases. Thus, the sensing current flowing through the sensing element 22 has a correlation with a main current flowing through the main element 21. An area ratio of the sensing element 22 to the main element 21 on the semiconductor substrate is, for example, approximately 1:100 to 1:1000. The sensing current flowing through the sensing element 22 is smaller than the main current flowing through the main element 21.

A gate of the main element 21 and a gate of the sensing element 22 are connected to the same gate pad G. A collector of the main element 21 and a collector of the sensing element 22 are mutually connected on, for example, the semiconductor substrate. An emitter of the main element 21 branches off to be connected to an emitter pad E and an emitter sensing pad Es. An emitter of the sensing element 22 is connected to a current sensing pad Cs. Connecting the respective pads disposed on the front surface of the semiconductor element 2 with signal terminals of a module via wires made of, for example, aluminum provides potentials of the respective pads to the signal terminals of the module of the semiconductor element 2.

Embodiment 1 will describe, but not limited to, a structure in which the semiconductor module 1 includes the single semiconductor element 2. The structure may be, for example, a structure in which the semiconductor module 1 includes a plurality of semiconductor elements 2 connected in parallel with each other and one of the semiconductor elements 2 is selectively used according to, for example, a potential of the gate pad G.

The semiconductor element 2 may be made of silicon or a wide bandgap semiconductor. Examples of the wide bandgap semiconductor include silicon carbide, a gallium nitride-based material, a gallium oxide, and diamond. The structure of the semiconductor device including the semiconductor element 2 made of a wide bandgap semiconductor can increase a withstand voltage of the semiconductor device.

The current sensor 3 includes wiring 31, a coil 32, and an operational amplifier 33. The wiring 31 connects a pin P1 that is a current input + pin to a pin P5 that is a current input − pin. The coil 32 is disposed to encircle the wiring 31.

A positive power supply of the operational amplifier 33 is connected to a pin P3 that is a sensor power supply pin, whereas a negative power supply of the operational amplifier 33 is connected to a pin P4 that is a sensor GND pin. A non-inverted input and an inverted input of the operational amplifier 33 are connected to the coil 32, whereas an output of the operational amplifier 33 is connected to a pin P2 that is an output signal pin.

When magnetic flux is generated from the current flowing through the wiring 31, the current sensor 3 with such a structure can sense an induced current generated in the coil 32 from the magnetic flux. Thus, the current sensor 3 can sense the current flowing through the wiring 31 based on the induced current, in a contactless manner with the wiring 31. A sensing result of the current sensor 3 is output from the pin P2. In Embodiment 1, the current sensor 3 is, but not limited to, a current sensor of a hall element type, and may be, for example, a current sensor of a current transformer (CT) type or a contactless current sensor other than the current sensor of the CT type.

Here, the current sensing pad Cs connected to the emitter that is an output of the sensing element 22, the pin P1, the pin P5, and the emitter sensing pad Es connected to the emitter that is an output of the main element 21 are connected through wiring 4. The sensing current flowing through the sensing element 22 flows through this wiring 4.

In Embodiment 1, at least a part of the wiring 4 is the wiring 31 of the current sensor 3. Thus, the current sensor 3 can sense the sensing current flowing through the sensing element 22 from the wiring 31 in a contactless manner. Although the current sensor 3 has a structure of sensing the sensing current flowing through the emitter side of the sensing element 22 in a contactless manner in Embodiment 1, the current sensor 3 may have a structure of sensing the sensing current flowing through the collector side of the sensing element 22 in a contactless manner.

The semiconductor element 2 including the main element 21 and the sensing element 22, and the current sensor 3 which are described above are packaged and included in the semiconductor module 1 that is a module. Since such a structure does not require disposing the current sensor 3 outside the semiconductor module 1, the structure of a peripheral circuit of the semiconductor module 1 can be simplified.

The driving substrate 6 includes a power supply 61, the ground 62, a micro-controller unit (MCU) 63, and a driving protection circuit 64. The power supply 61 is connected to the pin P3, and supplies a power potential to the operational amplifier 33. The ground 62 is connected to the pin P4, and supplies a ground potential to the operational amplifier 33. The ground 62 is electrically connected to the emitter sensing pad Es, which is not illustrated.

The MCU 63 is connected to the pin P2, and calculates the main current based on the sensing current sensed by the current sensor 3. For example, the MCU 63 calculates the main current by multiplying the sensing current by a certain current diversion ratio corresponding to a certain area ratio of the main element 21 to the sensing element 22 on the semiconductor substrate.

The driving protection circuit 64 controls the semiconductor element 2 including the main element 21 and the sensing element 22, based on the main current calculated by the MCU 63. For example, when the main current calculated by the MCU 63 is larger than or equal to a threshold, the driving protection circuit 64 reduces or stops driving of the semiconductor element 2.

Only the MCU 63 or the driving protection circuit 64 may calculate the main current which is performed by the MCU 63, and control the semiconductor element 2 which is performed by the driving protection circuit 64. The driving substrate 6 with the aforementioned structure can control the semiconductor element 2 including the main element 21 and the sensing element 22.

Figure 2:
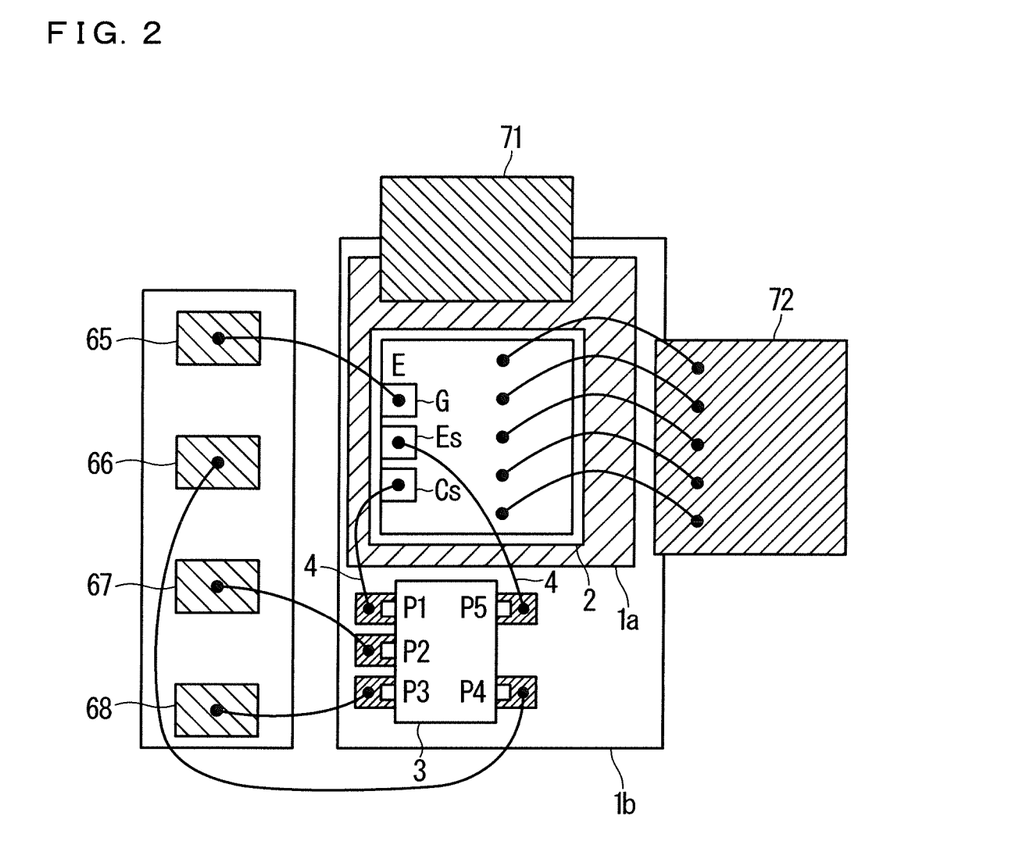
FIG. 2 is a plan view illustrating the structure of the semiconductor device according to Embodiment 1.

FIG. 2 is a plan view illustrating an example module structure to implement the circuit in FIG. 1. The pads of the semiconductor element 2, the pins of the current sensor 3, and the module control terminals for external connection of the driving substrate 6 are selectively connected via wires made of, for example, aluminum.

For example, the semiconductor element 2 and the current sensor 3 are bonded to an insulating substrate 1b on which a conductive pattern 1a is disposed, as illustrated in FIG. 2. The collectors of the main element 21 and the sensing element 22 are connected to a collector main current terminal 71 by the conductive pattern 1a. The emitter of the main element 21 is connected to an emitter main current terminal 72.

The module control terminals of the driving substrate 6 include a gate terminal 65, a sensor GND terminal 66, a current sensing terminal 67, and a sensor power supply terminal 68. The gate terminal 65 is connected to an output of the driving protection circuit 64 in FIG. 1, and is connected to the gate pad G through a wire. The sensor GND terminal 66 is connected to the ground 62 in FIG. 1, and is connected to the pin P4 through a wire. The current sensing terminal 67 is connected to an input of the MCU 63 in FIG. 1, and is connected to the pin P2 through a wire. The sensor power supply terminal 68 is connected to the power supply 61 in FIG. 1, and is connected to the pin P3 through a wire. The pin P1 is connected to the current sensing pad Cs through a wire of the wiring 4. The pin P5 is connected to the emitter sensing pad Es through a wire of the wiring 4.

[Summary of Embodiment 1]

Connecting the current sensing pad Cs to the emitter sensing pad Es through the wiring 4 as illustrated in FIG. 1 according to Embodiment 1 allows the emitters of the main element 21 and the sensing element 22 at the same potential. The sensing current in such a state is sensed in a contactless manner. Specifically, the sensing current is sensed in a contactless manner while gate-emitter voltages of the main element 21 and the sensing element 22 are equal and collector-emitter voltages of the main element 21 and the sensing element 22 are equal. This structure can increase the accuracy of sensing the sensing current and the main current, and reduce the size of the semiconductor device. The following will describe this.

Figure 3:
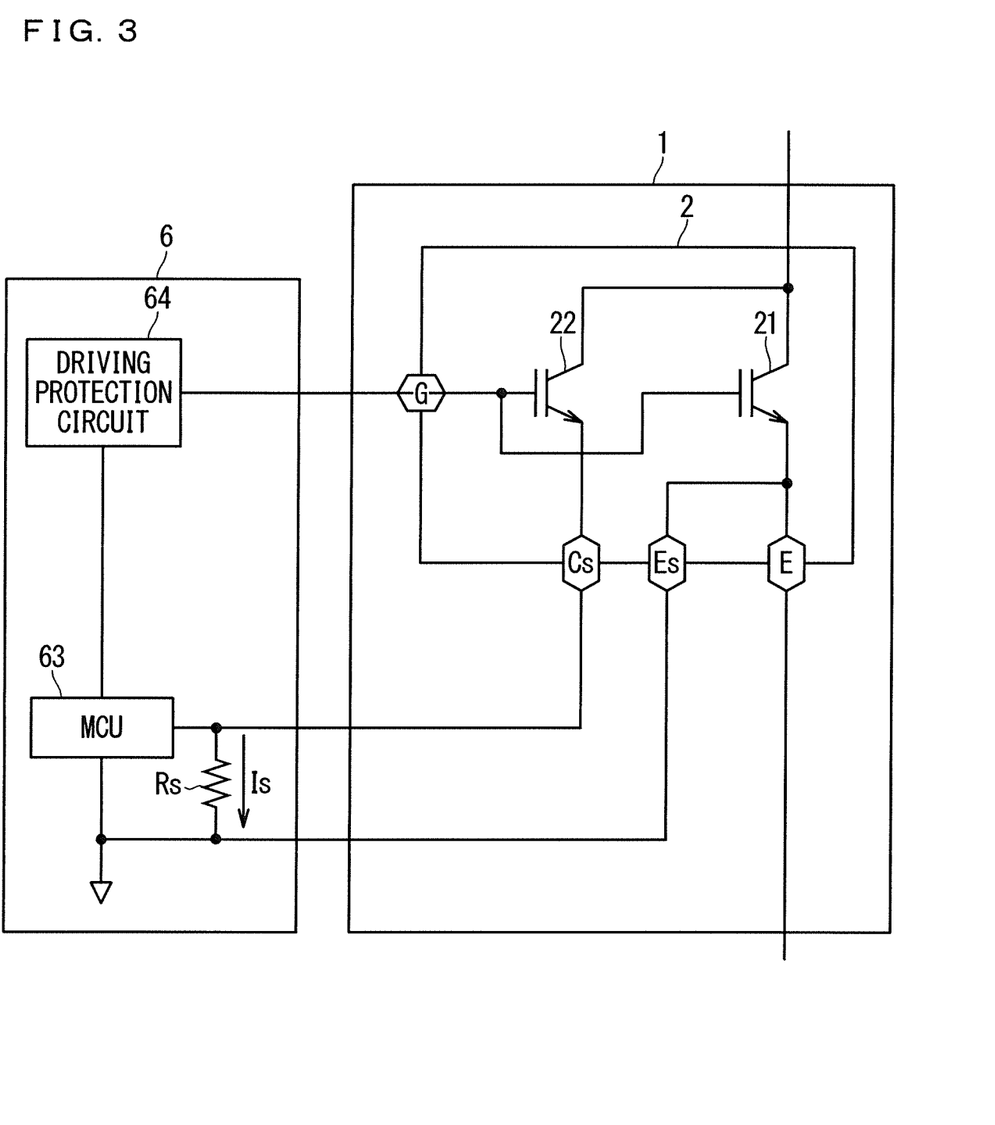
FIG. 3 is a circuit diagram illustrating a structure of a relevant device.

FIG. 3 is a circuit diagram illustrating a structure of a semiconductor device relevant to the semiconductor device according to Embodiment 1 (hereinafter referred to as a "relevant device"). In the relevant device, a sensing resistor Rs is disposed between a current sensing pad Cs and an emitter sensing pad Es, instead of the current sensor 3. The relevant device is configured to calculate a current value of the sensing current Is by dividing a value of a voltage generated in the sensing resistor Rs by a resistance value of the sensing resistor Rs.

However, the main element 21 and the sensing element 22 differ in biasing condition in this relevant device. Specifically, assume conditions where VCE denotes the collector-emitter voltage of the main element 21 and VGE denotes the gate-emitter voltage of the main element 21. Here, the collector-emitter voltage of the sensing element 22 is expressed by (VCE−Is×Rs) and the gate-emitter voltage of the sensing element 22 is expressed by (VGE−Is×Rs). An output of a current sensing signal varies due to such a difference between the main element 21 and the sensing element 22 and characteristics of the semiconductor element 2. Thus, there has been a problem in the accuracy of sensing the sensing current and the main current in the relevant device.

A possible structure for solving this problem is a structure including a current sensor that senses the main current itself in a contactless manner. However, since the main current is larger in value than the sensing current, there has been a problem of requiring a larger current sensor. In contrast, since the current sensor according to Embodiment 1 senses not the main current but the sensing current, a smaller current sensor is applicable. This consequently can reduce the size of the semiconductor device.

The current sensor 3 according to Embodiment 1 includes the wiring 31, and senses the sensing current from the wiring 31 in a contactless manner. Such a structure enables separate formation of the semiconductor element 2 and the current sensor 3. Thus, the semiconductor device can be efficiently formed. Moreover, a relatively simple process of connecting the semiconductor element 2 without the coil 32 to the current sensor 3 with the coil 32 can fabricate the semiconductor device.

Embodiment 2

Figure 4:
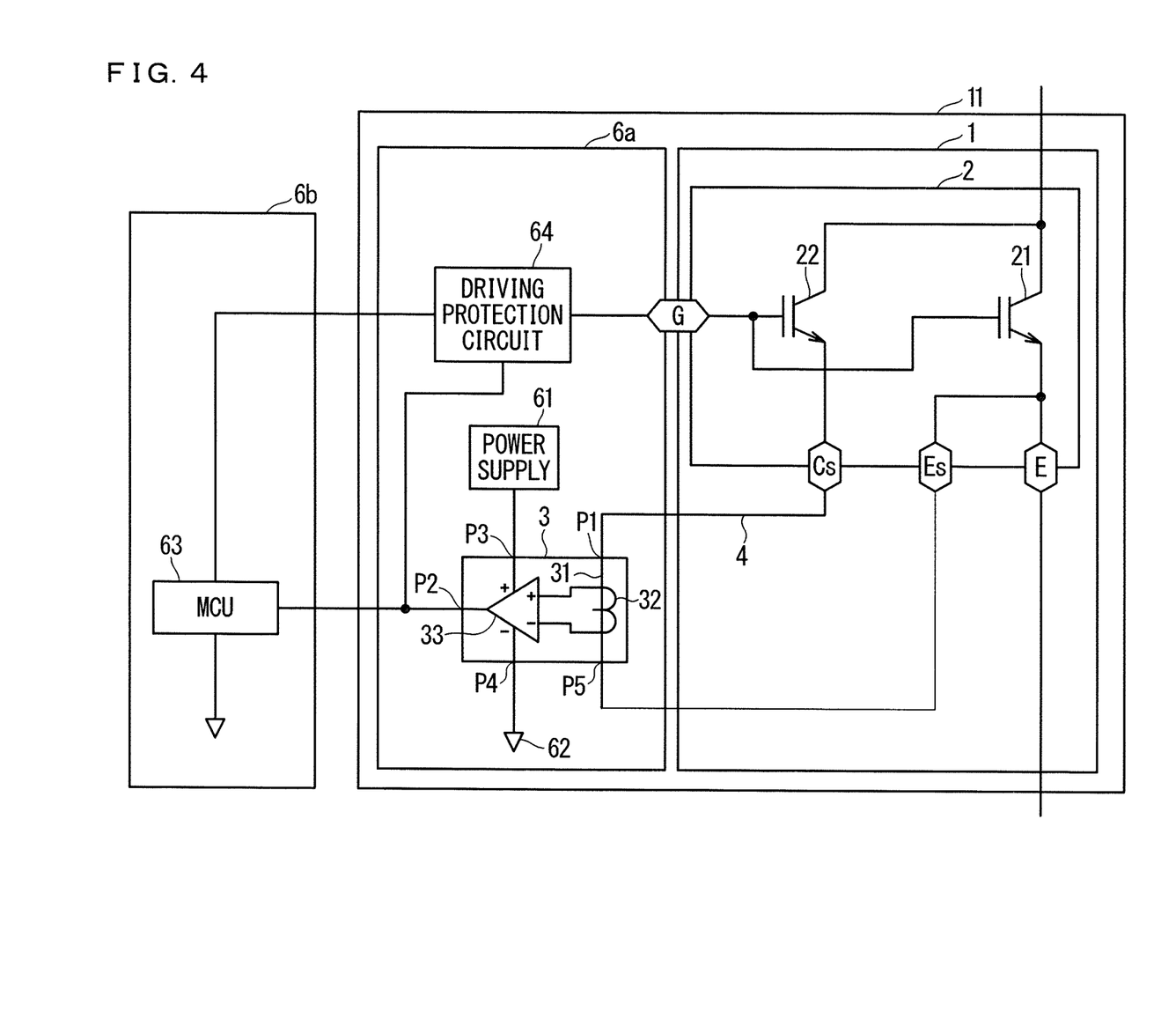
FIG. 4 is a circuit diagram illustrating a structure of a semiconductor device according to Embodiment 2.

FIG. 4 is a circuit diagram illustrating a structure of a semiconductor device according to Embodiment 2. The semiconductor element 2 and the current sensor 3, etc., according to Embodiment 2 are disposed differently from those according to Embodiment 1.

Specifically, the driving substrate 6 according to Embodiment 1 is divided into a driving protection circuit board 6a including the driving protection circuit 64, and a control circuit board 6b including the MCU 63. The current sensor 3 is disposed not on the semiconductor module 1 but on the driving protection circuit board 6a that is a circuit board. Then, the semiconductor module 1 including the main element 21 and the sensing element 22, and the driving protection circuit board 6a are packaged and included in an intelligent power module (IPM) 11 that is a module.

Figure 5:
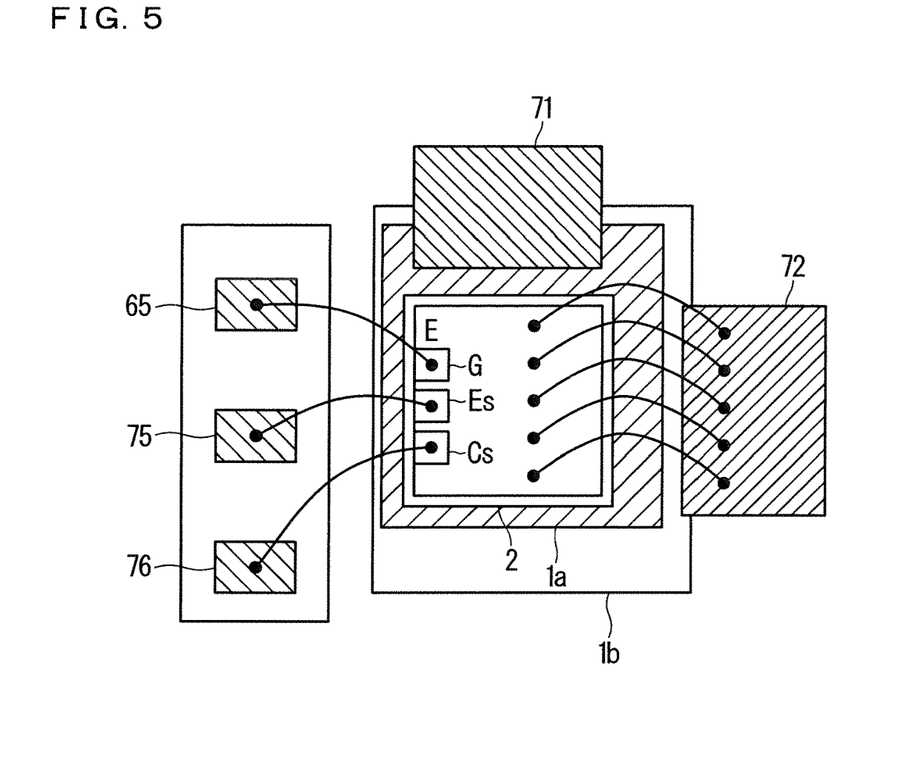
FIG. 5 is a plan view illustrating the structure of the semiconductor device according to Embodiment 2.
Figure 6:
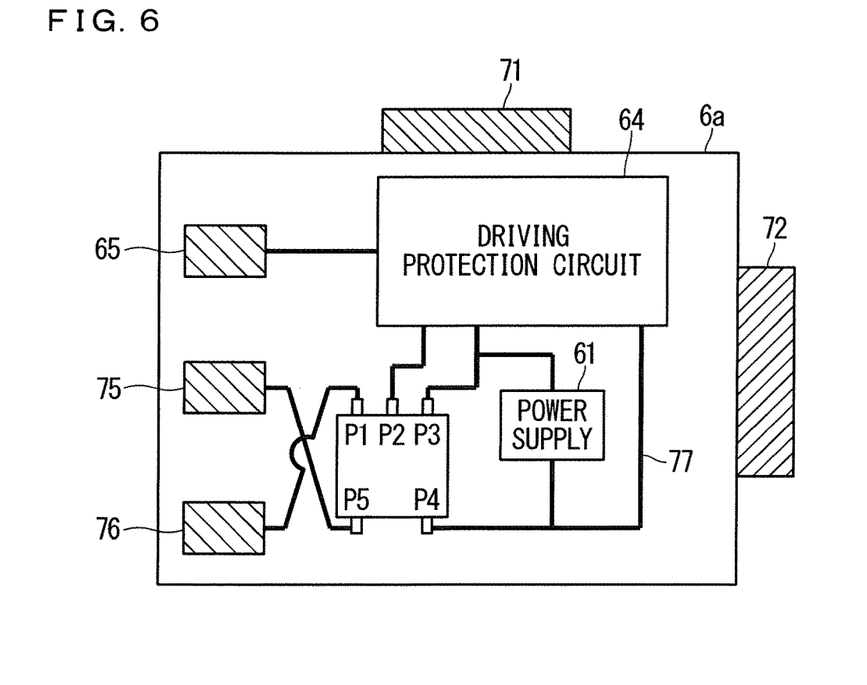
FIG. 6 is a plan view illustrating the structure of the semiconductor device according to Embodiment 2.

FIGS. 5 and 6 are plan views illustrating an example module structure to implement the circuit in FIG. 4.

FIG. 5 illustrates a structure of the insulating substrate 1b included in the semiconductor module 1. As illustrated in FIG. 5, the module control terminals include an emitter terminal 75 and a current sensing terminal 76, instead of the sensor GND terminal 66, the current sensing terminal 67, and the sensor power supply terminal 68. The emitter terminal 75 is connected to the emitter sensing pad Es through a wire, and the current sensing terminal 76 is connected to the current sensing pad Cs through a wire.

FIG. 6 illustrates a structure of the driving protection circuit board 6a mounted on the insulating substrate 1b in FIG. 5. As illustrated in FIG. 6, a conductive pattern 77 is disposed on the driving protection circuit board 6a. The gate terminal 65 is connected to the driving protection circuit 64 by the conductive pattern 77, the emitter terminal 75 is connected to the pin P5 by the conductive pattern 77, and the current sensing terminal 76 is connected to the pin P1 by the conductive pattern 77. The pin P2 is connected to the driving protection circuit 64 by the conductive pattern 77, and the pin P3 and the pin P4 are connected to the power supply 61 and the driving protection circuit 64 by the conductive pattern 77.

Since the semiconductor module 1 can be connected to the current sensor 3 by the conductive pattern 77 of the driving protection circuit board 6a according to Embodiment 2 described above, the wiring in the semiconductor module 1 is facilitated more than that according to Embodiment 1. Moreover, since the power supply in the driving protection circuit board 6a is applicable to the power supply of the current sensor 3, the wiring of the power supply is facilitated.

Embodiment 3

Figure 7:
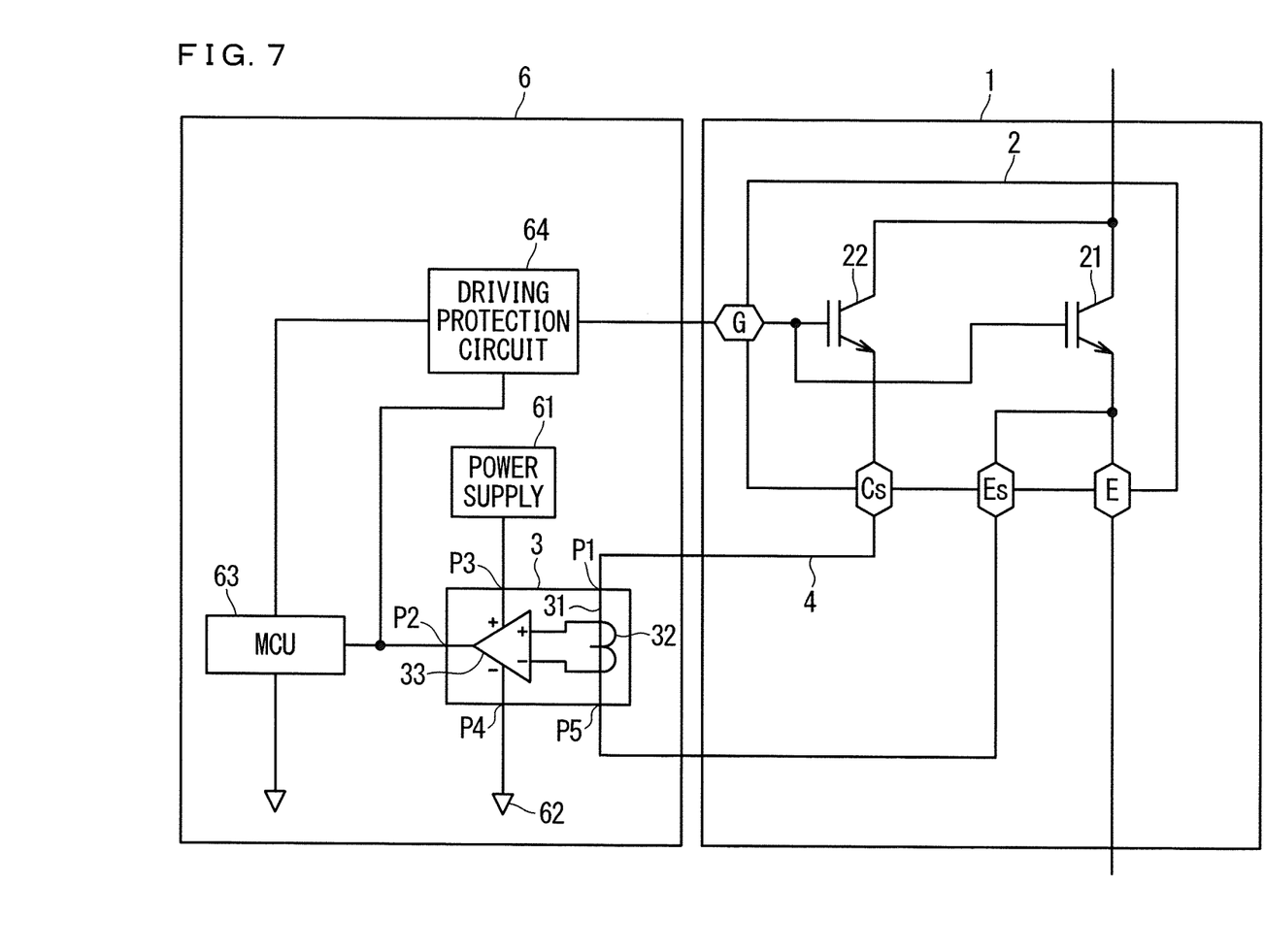
FIG. 7 is a circuit diagram illustrating a structure of a semiconductor device according to Embodiment 3.

FIG. 7 is a circuit diagram illustrating a structure of a semiconductor device according to Embodiment 3. The semiconductor element 2 and the current sensor 3, etc., according to Embodiment 3 are disposed differently from those according to Embodiments 1 and 2.

Specifically, the current sensor 3 is disposed not on the semiconductor module 1 but on the driving substrate 6 that is a circuit board. Although the semiconductor element 2 including the main element 21 and the sensing element 22 is packaged and included in the semiconductor module 1 (or an IPM) that is a module, the current sensor 3 is disposed outside the semiconductor module 1 (or an IPM).

Processes for manufacturing, for example, the semiconductor module 1 according to Embodiment 3 described above can be simplified more than those according to Embodiments 1 and 2 where the current sensor 3 is included in, for example, the semiconductor module 1.

Embodiment 4

A semiconductor device according to Embodiment 4 further includes a temperature sensing element that senses temperatures of the main element 21 and the sensing element 22. Although the temperature sensing element according to Embodiment 4 is a temperature-sensing diode included in the semiconductor element 2, the temperature sensing element may be, for example, a thermistor or a thermocouple.

The MCU 63 according to Embodiments 1 to 3 calculates the main current by multiplying the sensing current by a certain current diversion ratio. In contrast, the MCU 63 according to Embodiment 4 calculates the main current based on predefined inspection data, a sensing result of the current sensor 3, and the temperature sensed by the temperature sensing element. The inspection data includes, in association with each other, a correlation between the main current and the sensing current, and the temperatures of the main element 21 and the sensing element 22 which are associated with the correlation. In other words, the inspection data includes temperature characteristics of current diversion ratio characteristics between the main current and the sensing current. The inspection data is created and set, for example, in manufacturing a semiconductor device.

The MCU 63 according to Embodiment 4 is configured to correct the main current by determining, from the inspection data in which the main current is associated with the sensing current and the temperature, the main current corresponding to a combination of the sensing current sensed by the current sensor 3 and the temperature sensed by the temperature sensing element.

Figure 8:
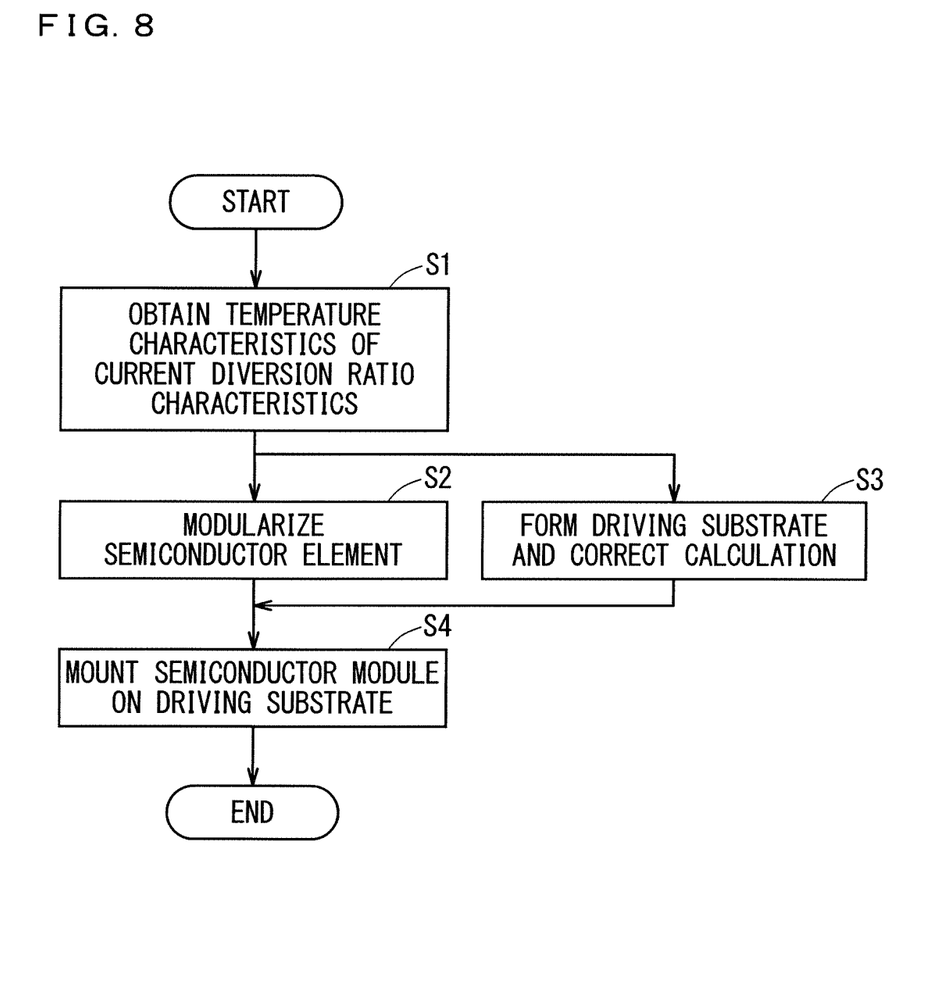
FIG. 8 is a flowchart illustrating a method for manufacturing a semiconductor device according to Embodiment 4.

FIG. 8 is a diagram illustrating a method for manufacturing the semiconductor device according to Embodiment 4. Although the following will describe application of the method to Embodiment 1, the same description is applied to Embodiments 2 and 3.

First, in Step S1, various measuring instruments that are not illustrated sense and obtain temperature characteristics of current diversion ratio characteristics of the semiconductor element 2 alone before the current sensor 3 and the driving substrate 6 are mounted. For example, the measuring instruments measure a main current value and a sensing current value, when the emitters of the main element 21 and the sensing element 22 of the semiconductor element 2 are directly connected and a collector current is passed with a voltage that more closely meets conditions on actual use between the gate and the emitter being applied therebetween. Then, while the temperature of the semiconductor element 2 is changed, the measuring instruments obtain, as the inspection data, the current diversion ratio characteristics obtained from the main current and the sensing current, and the temperature sensed by the temperature sensing element. This enables measurement of the main current with high accuracy.

In Step S2, packaging equipment that is not illustrated packages the semiconductor element 2 to form the semiconductor module 1.

In Step S3 in parallel with Step S2, fabricating equipment, etc., that is not illustrated forms the driving substrate 6 including the MCU 63 that can calculate the main current, and corrects the calculation by the MCU 63 using the inspection data. The fabricating equipment may perform this correction by adjusting the MCU 63 or its peripheral hardware or adjusting the software of the MCU 63.

In Step S4, mounting equipment that is not illustrated mounts the semiconductor module 1 on the driving substrate 6.

[Summary of Embodiment 4]

As described in Embodiments 1 to 3, even when the emitters of the main element 21 and the sensing element 22 are at the same potential for unifying biasing conditions of the elements, a current diversion ratio is not completely compatible with an area ratio due to characteristic variations in the plane of the semiconductor element 2 and the temperature of the semiconductor element. Since the main current is sensed based on the inspection data including the temperature characteristics of the current diversion ratio characteristics in Embodiment 4, the main current can be corrected and sensed with high accuracy even when the current diversion ratio is not compatible with the area ratio.

The inspection data in the description above includes, but not limited to, the temperature characteristics of the current diversion ratio characteristics. For example, the inspection data may include a correlation between the main current and the sensing current, without the temperature. In other words, the MCU 63 may determine, from the inspection data in which the main current is associated with the sensing current, the main current corresponding to the sensing current sensed by the current sensor 3.

Embodiment 5

In Embodiment 5, the inspection data described in Embodiment 4 is printed on the front surface of the semiconductor module 1 including the main element 21 and the sensing element 22.

Figure 9:
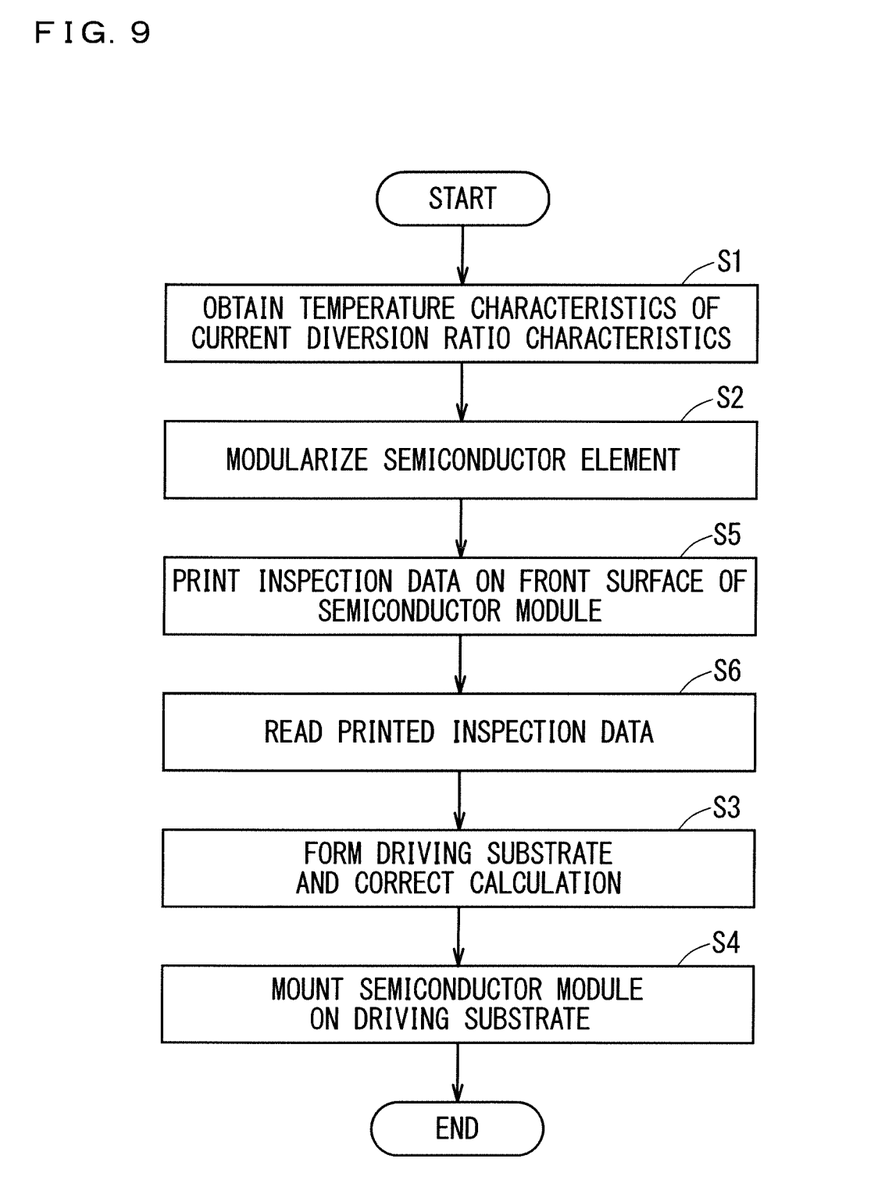
FIG. 9 is a flowchart illustrating a method for manufacturing a semiconductor device according to Embodiment 5.

FIG. 9 is a diagram illustrating a method for manufacturing a semiconductor device according to Embodiment 5.

In Steps S1 and S2, the same processes as those in Steps S1 and S2 of FIG. 8 which are described in Embodiment 4 are performed.

In Step S5, printing equipment that is not illustrated prints the inspection data obtained in Step S1 on the front surface of the semiconductor module 1 formed in Step S2.

In Step S6, reading equipment that is not illustrated reads the inspection data printed on the front surface of the semiconductor module 1.

In the following Steps S3 and S4, the same processes as those in Steps S3 and S4 of FIG. 8 which are described in Embodiment 4 are performed, using the inspection data read in Step S6.

Embodiment 5 described above facilitates association between the inspection data and the semiconductor module 1, and can increase the handleability of the inspection data. Even without any system such as a database for passing the inspection data between a production line for the semiconductor module 1 and a production line for the driving substrate 6, the MCU 63 can be formed using the printed inspection data.

Embodiment 6

The MCU 63 according to Embodiment 4 corrects the main current. In contrast, selecting the sensing element 22 from among a plurality of sensing element candidates can correct the main current in Embodiment 6, which will be described below.

Figure 10:
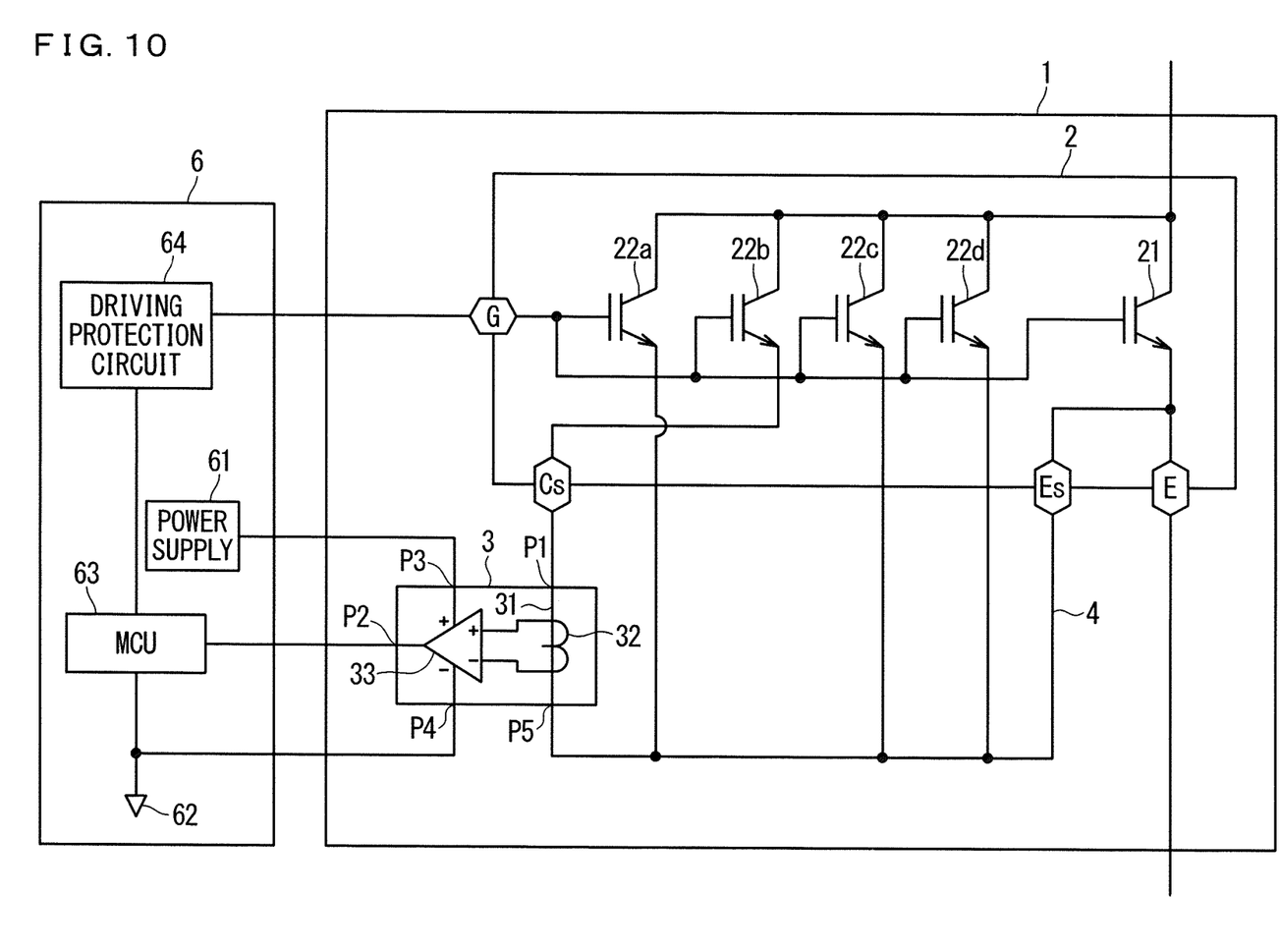
FIG. 10 is a circuit diagram illustrating a structure of a semiconductor device according to Embodiment 6.

FIG. 10 is a circuit diagram illustrating a semiconductor device according to Embodiment 6. The semiconductor element 2 in FIG. 10 includes sensing element candidates 22a to 22d as a plurality of second semiconductor element candidates with different areas on the semiconductor substrate. The number of the sensing element candidates is, but not limited to, four.

In Embodiment 6, the areas of the sensing element candidates 22a to 22d form a geometric progression. For example, assuming that S denotes the smallest area among the areas of the sensing element candidates 22a to 22d, the remaining areas are expressed by $S \times 2^1$, $S \times 2^2$, and $S \times 2^3$. Assuming that the number of the sensing element candidates is n and S denotes the smallest area among areas of the n sensing element candidates, the remaining areas are expressed by $S \times 2^1$, $S \times 2^2$, ..., and $S \times 2^{n-1}$.

The sensing element 22 is selected from among the sensing element candidates 22a to 22d, based on the inspection data including correlations between the main current flowing through the main element 21 and sensing currents flowing through the sensing element candidates 22a to 22d. The inspection data according to Embodiment 6 is identical to that according to Embodiment 4. A correlation the most compatible with a current diversion ratio to be used by the MCU 63 is selected from among the correlations included in the inspection data, and the sensing element candidate with the selected correlation is selected as the sensing element 22.

In the example of FIG. 10, as a result of selecting the sensing element candidate 22b as the sensing element 22, the current sensing pad Cs of the sensing element candidate 22b is connected to the pin P1 of the current sensor 3. Then, current sensing pads of the sensing element candidates 22a, 22c, and 22d that are not illustrated in FIG. 10 are connected to the emitter sensing pad Es. These are connected in manufacturing a semiconductor device. Selecting the single sensing element candidate 22b as the sensing element 22 in the example of FIG. 10 is not exclusively limited to this, but a plurality of sensing element candidates 22b may be selected as sensing elements 22.

Since the sensing element 22 is selected based on the inspection data, Embodiment 6 described above enables correction of the main current and sensing the main current with high accuracy. Since the areas of the sensing element candidates 22a to 22d form a geometric progression, the sensing current to be used for calculating the main current can be corrected, for example, in $2^n$ levels.

Embodiment 7

In Embodiment 7, the inspection data of the sensing element candidate described in Embodiment 6 is printed on the front surface of the sensing element candidate.

Figure 11:
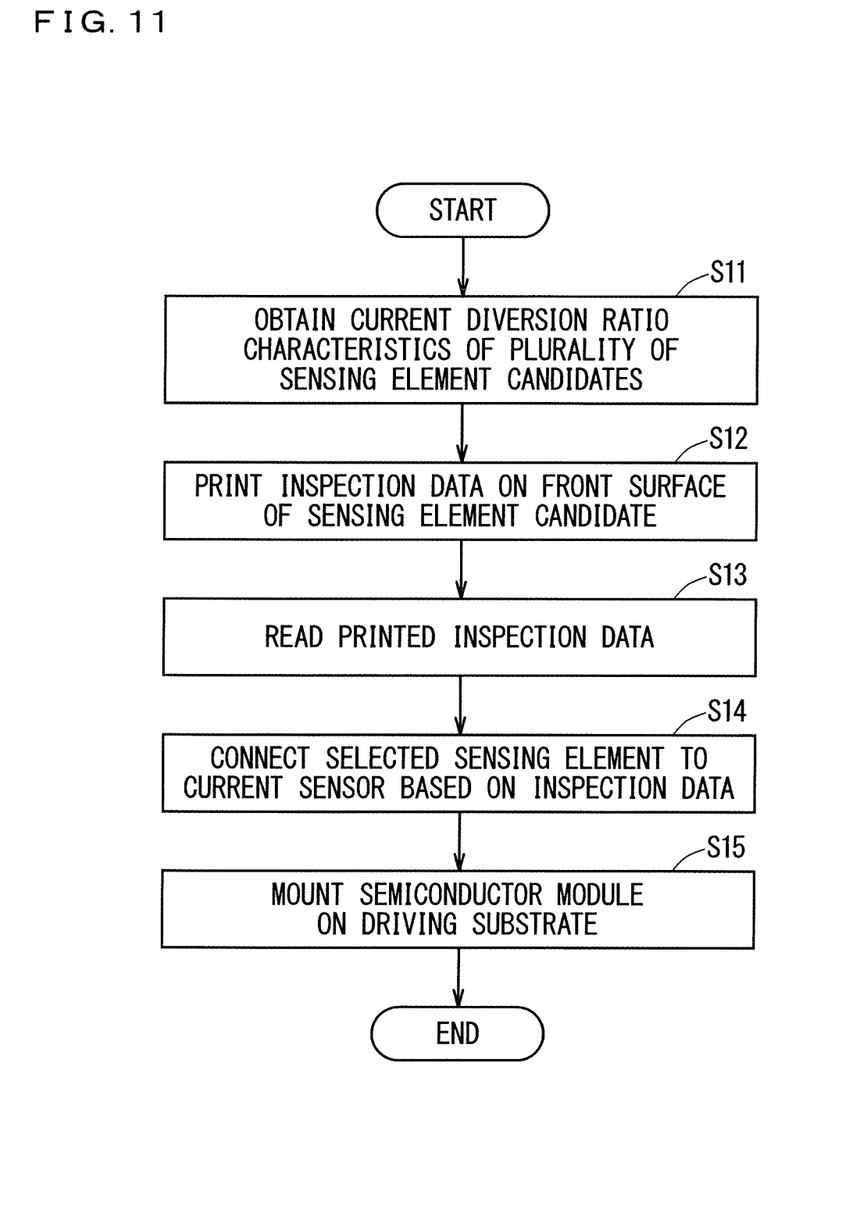
FIG. 11 is a flowchart illustrating a method for manufacturing a semiconductor device according to Embodiment 7.

FIG. 11 is a diagram illustrating a method for manufacturing a semiconductor device according to Embodiment 7.

In Step S11, various measuring instruments that are not illustrated sense and obtain current diversion ratio characteristics of a plurality of sensing element candidates of the semiconductor element 2 alone before the current sensor 3 and the driving substrate 6 are mounted.

In Step S12, printing equipment that is not illustrated prints the inspection data obtained in Step S11 on the front surface of a corresponding one of the sensing element candidates. In Step S13, reading equipment that is not illustrated reads the inspection data printed on the front surface of the semiconductor module 1. In Step S14, wire bonding equipment that is not illustrated connects the selected sensing element 22 to the current sensor 3, based on the inspection data.

In Step S15, mounting equipment that is not illustrated mounts the semiconductor module 1 on the driving substrate 6.

Embodiment 7 described above facilitates association between the inspection data and the sensing element candidates, and can increase the handleability of the inspection data.

Embodiments can be freely combined, and appropriately modified or omitted.

The foregoing description is in all aspects illustrative, and is not restrictive. Therefore, numerous modifications that have yet been exemplified will be devised.

EXPLANATION OF REFERENCE SIGNS 1 semiconductor module, 3 current sensor, 6 driving substrate, 11 IPM, 21 main element, 22 sensing element, 22a to 22d sensing element candidate.

The invention claimed is:

1. A semiconductor device, comprising:
a first semiconductor element through which a main current is configured to flow;
a second semiconductor element which includes an output electrode connected to an output electrode of the first semiconductor element through wiring and through which a sensing current is configured to flow, the sensing current having a correlation with the main current; and
a current sensor configured to sense the sensing current in a contactless manner,
wherein the sensing current is configured to flow between the output electrode of the second semiconductor element and an other electrode of the second semiconductor element,
the main current is configured to flow between the output electrode of the first semiconductor element and an other electrode of the first semiconductor element,
the output electrode of the first semiconductor element and the output electrode of the second semiconductor element are connected to a common node, and
the other electrode of the first semiconductor element and the other electrode of the second semiconductor element are connected to another common node.

2. The semiconductor device according to claim 1, wherein the current sensor includes at least a part of the wiring, and the current sensor is configured to sense the sensing current from the at least the part in a contactless manner.

3. The semiconductor device according to claim 1, wherein the first semiconductor element, the second semiconductor element, and the current sensor are included in a module.

4. The semiconductor device according to claim 1, further comprising:
a circuit board configured to control the first semiconductor element and the second semiconductor element,
wherein the current sensor is disposed on the circuit board, and
the first semiconductor element, the second semiconductor element, and the circuit board are included in a module.

5. The semiconductor device according to claim 1, further comprising:
a circuit board configured to control the first semiconductor element and the second semiconductor element,
wherein the current sensor is disposed on the circuit board, and
the first semiconductor element and the second semiconductor element are included in a module, and the circuit board is disposed outside the module.

6. The semiconductor device according to claim 1, further comprising:
a controller configured to sense the main current based on inspection data and a sensing result of the current sensor, the inspection data including the correlation between the main current and the sensing current.

7. The semiconductor device according to claim 6, further comprising:
a temperature sensing element configured to sense temperatures of the first semiconductor element and the second semiconductor element, wherein the inspection data further includes the temperatures of the first semiconductor element and the second semiconductor element that are associated with the correlation, and the controller is configured to sense the main current based on the inspection data, the sensing result of the current sensor, and the temperatures sensed by the temperature sensing element.

8. The semiconductor device according to claim 6, wherein the inspection data is printed on a front surface of a module including the first semiconductor element and the second semiconductor element.

9. The semiconductor device according to claim 1, wherein the second semiconductor element is selected from among a plurality of second semiconductor element candidates with different areas on a semiconductor substrate, based on inspection data including correlations between the main current and sensing currents flowing through the plurality of second semiconductor element candidates.

10. The semiconductor device according to claim 9, wherein the areas of the plurality of second semiconductor element candidates form a geometric progression.

11. The semiconductor device according to claim 9, wherein the inspection data of the second semiconductor element candidate is printed on a front surface of the second semiconductor element candidate.

12. The semiconductor device according to claim 1, wherein the main current is configured to flow through the output electrode of the first semiconductor element and the sensing current is configured to flow through the output electrode of the second semiconductor element.

13. The semiconductor device according to claim 1, wherein the first semiconductor element and the second semiconductor element are configured such that the sensing current is smaller than the main current when both the first semiconductor element and the second semiconductor element are in an ON state.

* * * * *